United States Patent
Li

(10) Patent No.: US 6,235,565 B1
(45) Date of Patent: May 22, 2001

(54) SIMPLIFIED PROCESS FLOW FOR CMOS FABRICATION

(75) Inventor: Lixia Li, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/392,855

(22) Filed: Sep. 9, 1999

Related U.S. Application Data

(60) Provisional application No. 60/100,031, filed on Sep. 11, 1998.

(51) Int. Cl.$^7$ .................................................. H01L 21/8238
(52) U.S. Cl. ........................... 438/199; 438/228; 438/217
(58) Field of Search ..................................... 438/197, 199, 438/217, 229, 218, 225, 227, 228, 289

(56) References Cited

U.S. PATENT DOCUMENTS 5,985,743 * 11/1999 Gardner .

* cited by examiner

*Primary Examiner*—Charles Bowers
*Assistant Examiner*—Evan Pert
(74) *Attorney, Agent, or Firm*—Wade James Brady, III; Frederick J. Telecky, Jr.

(57) ABSTRACT

A method of fabricating a semiconductor device wherein there is provided a semiconductor substrate of a first conductivity type. A dopant is implanted in one region of the substrate of opposite conductivity type and that region is masked, preferably with a silicon oxide mask. A relatively heavy dose of a dopant of the first conductivity type is implanted in a different region of the substrate while retaining the mask on the region of the substrate doped with dopant of the opposite conductivity type. The two implants are driven farther into the substrate to form a first tank of said first conductivity type and a second tank of opposite conductivity type by an annealing step while retaining the mask on the region of the substrate doped with dopant of the opposite conductivity type. A second implant of the first conductivity type is then implanted into the tank of first conductivity type while retaining the mask on the region of the substrate doped with dopant of the opposite conductivity type. Fabrication of the device is then completed in standard manner except that there is no $V_{tn}$ pattern and there are no $V_{tn}$ implants. The second implant of the first conductivity type has a lower dosage then the prior implant of first conductivity type. The higher dosage implant of the first conductivity type is provided to set the depth of the tank and is from about $6 \times 10^{12}/cm^2$ to about $1.9 \times 10^{13}/cm^2$. The lower dosage implant of the first conductivity type is from about $1 \times 10^{12}/cm^2$ to about $8 \times 10^{12}/cm^2$.

20 Claims, 3 Drawing Sheets

SIMPLIFIED PROCESS FLOW FOR CMOS FABRICATION

This application claims priority under 35 USC § 119(e)(1) of provisional application number 60/100,031 filed Sep. 11 1998.

BACKGROUND OF THE INVENTION

1. Field of the Invention

This invention relates to a novel procedure for fabrication of MOSFETs which modifies and eliminates steps required by the prior art to provide a reduced cost and simplified fabrication process.

2. Brief description of the Prior Art

MOSFET fabrication according to a standard prior art process flow requires a large number of steps. It is known that yield generally increases and costs generally decrease by the elimination of and/or alteration of steps in the process flow and such elimination of steps and/or alteration of steps is constantly sought in the art.

Assuming commencement of fabrication with a p-type substrate (it being understood that the procedure can be operated with commencement of fabrication with an n-type substrate with all polarities reversed), an oxide and nitride layer are initially formed in that order and patterned on a substrate surface. An n-type tank is implanted into the substrate through the exposed portion of the pattern and a tank oxide is then formed over the n-type tank by removal of the nitride layer over the n-tank region followed by oxidation of the exposed region. The remaining nitride is removed and, in accordance with the prior art, a relatively low dose p-type tank implant, generally from about $2 \times 10^{12}/cm^2$ to about $1.3 \times 10^{13}/cm^2$ at about 50 KeV and preferably about $6 \times 10^{12}/cm^2$ at 50 KeV is provided in the portion of the surface of the substrate which not masked by the tank oxide to provide a p-type tank. It is well understood that the 50 KeV energy figure used is selected in deference to the type and thickness of masks used or existing and will be sufficiently high to penetrate any mask which is intended to be penetrated and be sufficiently low so as not to penetrate any mask which is not intended to be penetrated. The dopants in the tanks and which will define the tanks are then driven farther into the substrate by annealing to define tank depth. There is then provided a second oxide and nitride deposition with patterning and etching of the second nitride deposition to form the moat or active region for the MOSFET after removal of the tank oxide, the second nitride pattern also permitting growth of a field oxide around the MOSFET, a field oxide over the junction of the n-type tank and the p-type tank. A dummy oxide is then grown over the p-type tank and the n-type tank after removal of remaining nitride. A layer of photoresist is then formed over the n-type tank extending onto the field oxide and leaving the p-type tank exposed. A p-type implant is then provided into the p-type tank to set the threshold voltage of the MOSFET, this being followed by a p-type punchthrough implant in the same region to prevent punchthrough during transistor operation. This is followed by a p-type channel stop implant followed by an implant ashing step to remove the photoresist. The n-type tank region is then patterned in standard manner in both the prior art and in accordance with the present invention to provide a p-channel for a p-channel MOSFET.

SUMMARY OF THE INVENTION

It can be seen that, in accordance with the present invention, the channel profile for the n-channel device is provided by using an optimized p-tank implant dose and an after-tank-drive implant to replace the $V_{tn}$ pattern and three $V_{tn}$ implants in the prior art MOSFET process. A major difference compared with the prior art is that the process flow in accordance with the present invention utilizes the initially formed tank oxide as a mask for further implantation into the p-type tank as opposed to the removal thereof and replacement with a photoresist as in the prior art. Accordingly, with the tank oxide still in place, there is provided, after the initial p-tank implant, the after-tank-drive implants, these being both a $V_{tn}$ implant to set the threshold voltage of the transistor and a channel stop implant for the n-channel transistor. The first high dose implant and drive-in process are used to set the P-tank depth and profile that keeps the transistor out of punchthrough. The second low dose implant is used to set the N-channel threshold voltage and the profile that isolates the transistors in the chip from each other. The significance of the drive in of the first implant prior to the second implant is to keep the channel doping profile and tank profile close to the currently used processes so that the transistor can function in the same manner is with the prior art process flow while simplifying the process flow. If the second implant is used prior to drive-in, a larger dose ($>1.9 \times 10^{13}/cm^2$) is required to insure proper doping profile in the silicon surface and under the field oxide because the drive-in process makes the dopant species diffuse into the silicon. The larger dose implant before drive-in causes a much deeper P-tank junction and also leads to hot carrier problems. Since an optimized p-tank dose is used, this approach simplifies the prior art NMOSFET process flow while maintaining and even possibly improving the NMOSFET performance. An optimized dose is defined herein as a dose in the range that will not lead to extra channel hot carriers while maintaining the transistor from undergoing punchthrough, these parameters defining the dose range.

More specifically, in accordance with the present invention, the dose of dopant is provided in two steps as opposed to the prior art four step process to provide the same results, the first dose being increased to from about $6 \times 10^{12}/cm^2$ to about $1.9 \times 10^{13}/cm^2$ at 50 KeV and preferably about $1.6 \times 10^{13}/cm^2$ at 50 KeV. The dopants in the tanks are then driven farther into the substrate by annealing. At this point in the fabrication, the process flow in accordance with the present invention again departs from that of the prior art by providing a second low dose p-type implant of from about $1 \times 10^{12}/cm^2$ to about $8 \times 10^{12/cm2}$ at 50 KeV and preferably about $3.3 \times 10^{12}/cm^2$ to set the threshold voltage of the device. The steps performed provide the adjustments required to provide the desired channel profile for an n-channel device. All that remains to complete fabrication is to provide the source/drain regions in standard manner. The p-channel device is fabricated following standard prior art techniques.

DESCRIPTION OF THE PREFERRED EMBODIMENT

Figure 1A:
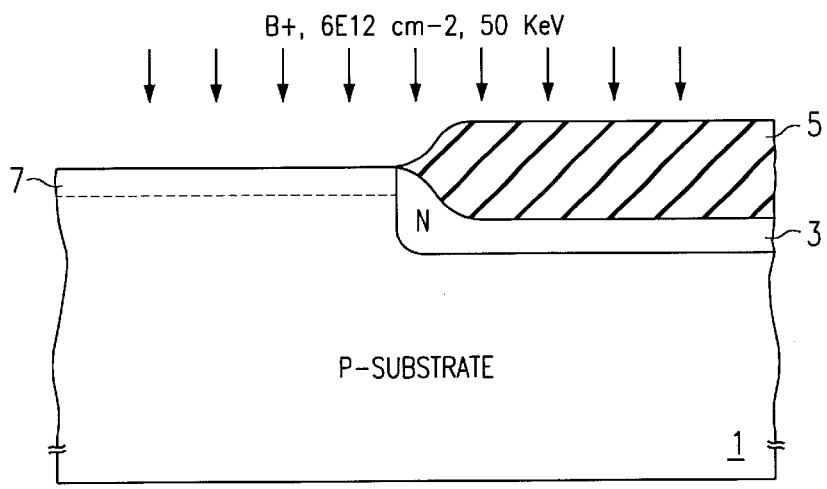
FIGS. 1a to 1e are a process flow for fabrication of a MOSFET in accordance with the prior art.
Figure 1B:
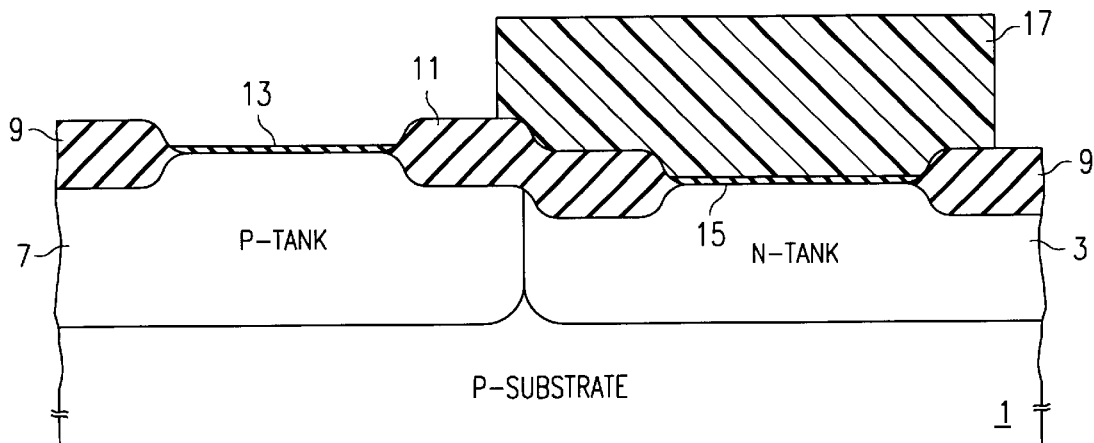
Figure 1C:
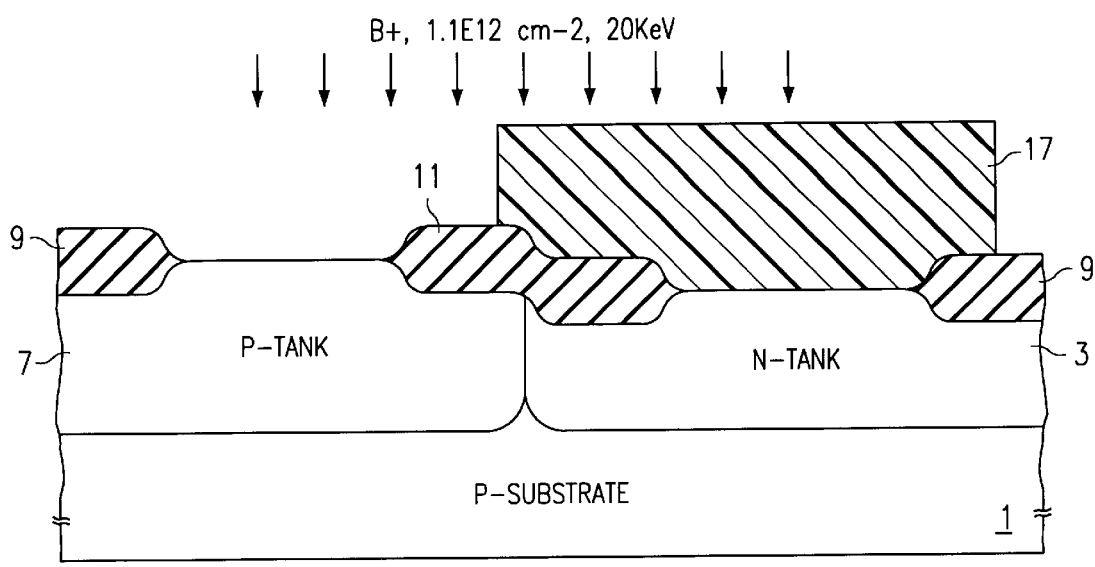
Figure 1D:
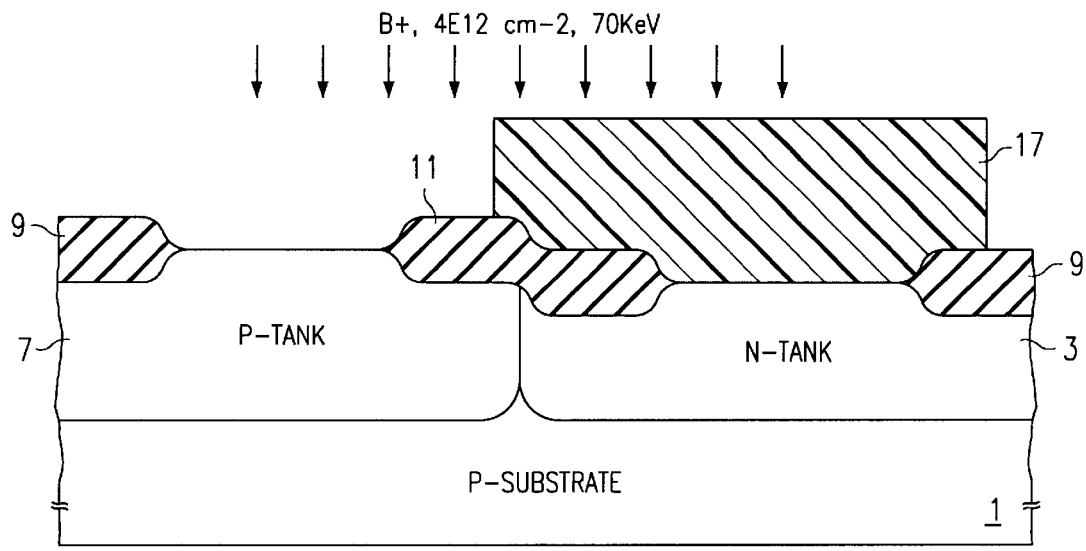
Figure 1E:
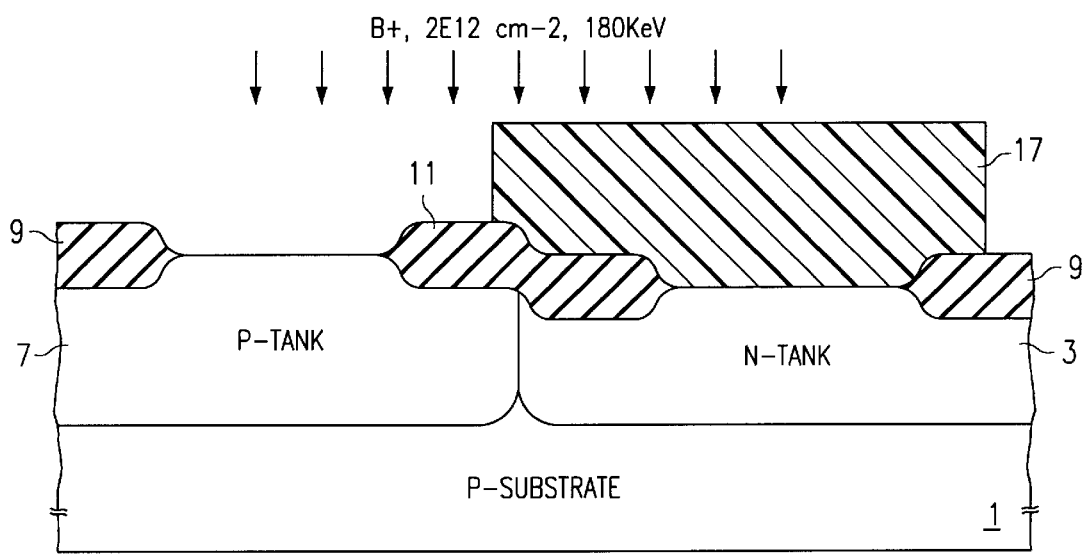
Figure 2A:
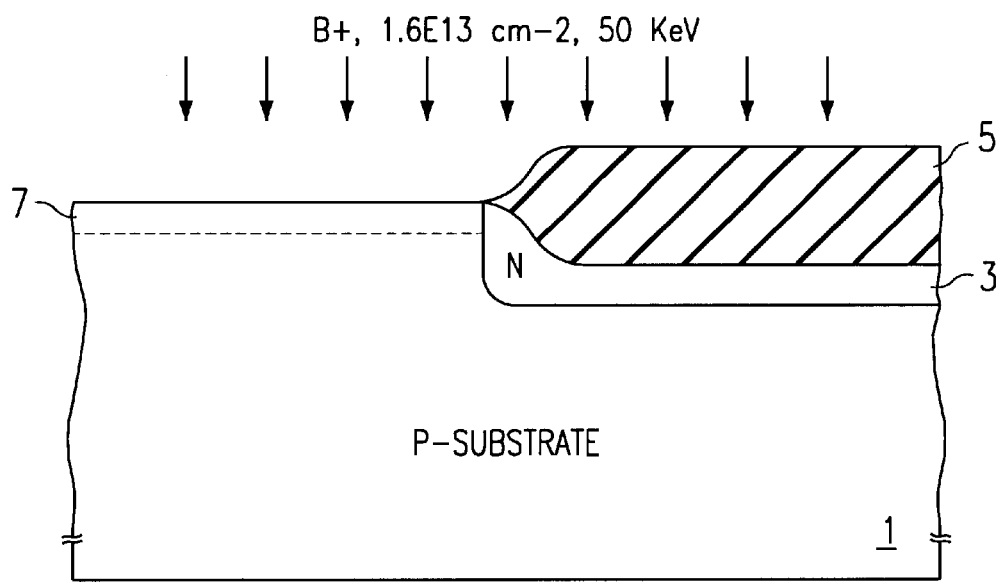
FIGS. 2a and 2b describe process steps in accordance with the present invent which depart from the prior art fabrication process.
Figure 2B:
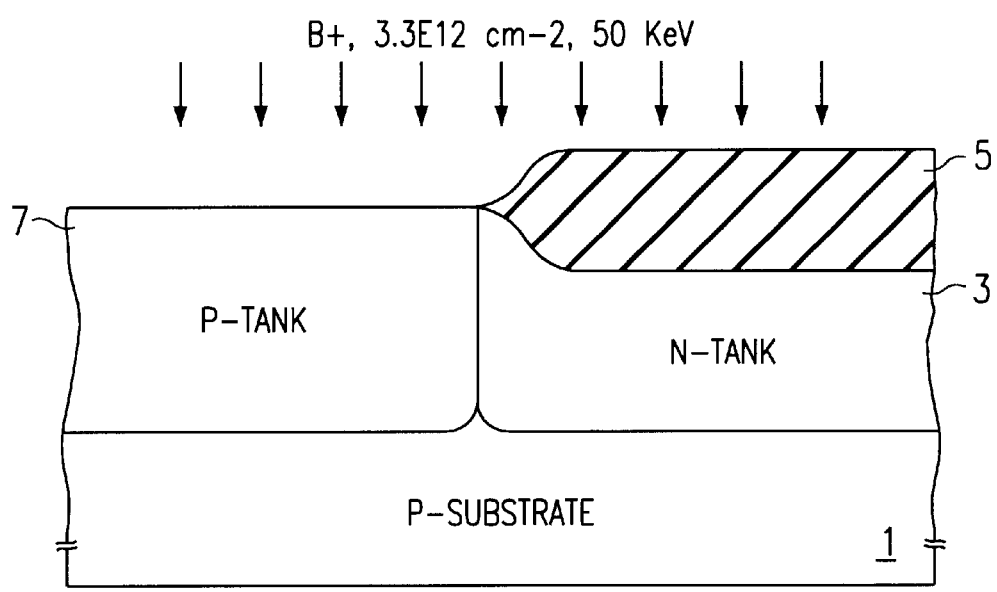

Referring first to FIGS. 1a to 1e which embody a prior art process flow and FIGS. 2a and 2b which set forth the alterations in the prior art process flow in accordance with the present invention for fabrication of MOSFETs, and assuming commencement of fabrication with a p-type silicon substrate 1 (it being understood that the procedure can be operated with commencement of fabrication with an n-type substrate with all polarities reversed), an oxide and nitride layer (not shown) are initially formed in that order and patterned on the substrate surface. An n-type tank 3 is implanted into the substrate through the exposed portion of the pattern. A tank oxide 5 is then formed over the n-type tank 3 by removal of the nitride layer over the n-tank region followed by oxidation of the exposed substrate 1. The remaining nitride is removed and, in accordance with the prior art, a relatively low dose p-type tank implant of about $6 \times 10^{12}/cm^2$ at 50 KeV is provided in the surface of the substrate 1 not masked by the tank oxide to provide a p-type tank 7, resulting in the structure as shown in FIG. 1a. In accordance with the present invention, the dose of dopant is increased to about $1.6 \times 10^{13}/cm^2$ at 50 KeV as shown in FIG. 2a. The dopants in the tanks 3 and 7 are then driven farther into the substrate 1 by annealing. At this point in the fabrication, the process flow in accordance with the present invention again departs from that of the prior art by providing a second low dose p-type implant of about $3.3 \times 10^{12}/cm^2$ to set the threshold voltage of the device and set the channel stop doping profile, as shown in FIG. 2b. The steps performed in FIGS. 2a and 2b provide the adjustments required to provide the desired channel profile for an n-channel device.

In accordance with the prior art and the invention herein, there is provided a second pad oxide and nitride deposition with patterning and etching of the second nitride deposition to form the moat or active region for the MOSFET after removing the tank oxide 5. The second nitride pattern also permits growing of a field oxide 9 around the MOSFET, a field oxide 11 over the junction of the n-type tank 3 and the p-type tank 7, a dummy oxide 13 is then grown over the p-type tank and a dummy oxide 15 is grown over the n-type tank after removal of the remaining nitride, as shown in FIG. 1b.

At this point, the prior art requires formation of a layer of photoresist 17 over the n-type tank 3 extending onto the field oxide 9 and 11, leaving the p-type tank 7 exposed as shown in FIG. 1b. A p-type implant is then provided into the p-type tank 7 to set the threshold voltage of the MOSFET as shown in FIG. 1c. Then a p-type punchthrough implant is then provided in the same region as the transition voltage implant as shown in FIG. 1d. This is followed by a p-type channel stop implant as shown in FIG. 1e followed by an implant ashing step to remove the photoresist. The steps depicted in FIGS. 1b to 1e and the ashing step are not required in accordance with the present invention.

The n-type tank region is then patterned in standard manner in both the prior art and in accordance with the present invention to provide a p-channel.

It can be seen that, in accordance with the present invention, the channel profile for the n-channel device is provided by using an optimized p-tank implant dose and an after-tank-drive implant to replace a $V_{tn}$ pattern and three $V_{tn}$ implants in a MOSFET process. A major difference compared with the prior art is that the process flow in accordance with the present invention utilizes the after-tank-drive implant as both a $V_{tn}$ implant and a channel stop implant for an n-channel transistor. Since an optimized p-tank dose was used, this approach simplifies the NMOSFET process flow while maintaining and even improving the NMOSFET performance.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating a CMOS semiconductor device which comprises the steps of:
   (a) providing a semiconductor substrate of a first conductivity type;
   (b) implanting in a first region of said substrate a dopant of opposite conductivity type and then masking the region of said substrate doped with dopant of said opposite conductivity type;
   (c) implanting in a second region of said substrate a dopant of said first conductivity type while retaining said mask on the region of said substrate doped with dopant of said opposite conductivity type;
   (d) driving each of said implants farther into said substrate to form a first tank of said first conductivity type and a second tank of opposite conductivity type while still retaining said mask on the region of said substrate doped with dopant of said opposite conductivity type;
   (e) then implanting in said tank of first conductivity type a second implant of said first conductivity type while retaining said mask on the region of said substrate doped with dopant of said opposite conductivity type; and
   (f) completion of fabrication of said device.

2. The method of claim 1 wherein said mask is an oxide of silicon.

3. The method of claim 1 wherein second implant of said first conductivity type has a lower dosage then the said prior implant of said first conductivity type.

4. The method of claim 2 wherein second implant of said first conductivity type has a lower dosage then the said prior implant of said first conductivity type.

5. The method of claim 3 wherein the higher dosage implant is provided to set the depth of the tank and is from about $6 \times 10^{12}/cm^2$ to about $1.9 \times 10^{13}/cm^2$.

6. The method of claim 4 wherein the higher dosage implant is provided to set the depth of the tank and is from about $6 \times 10^{12}/cm^2$ to about $1.9 \times 10^{13}/cm^2$.

7. The method of claim 3 wherein the lower dosage implant is from about $1 \times 10^{12}/cm^2$ to about $8 \times 10^{12}/cm^2$.

8. The method of claim 4 wherein the lower dosage implant is from about $1 \times 10^{12}/cm^2$ to about $8 \times 10^{12}/cm^2$.

9. The method of claim 5 wherein the lower dosage implant is from about $1 \times 10^{12}/cm^2$ to about $8 \times 10^{12}/cm^2$.

10. The method of claim 6 wherein the lower dosage implant is from about $1\times10^{12}/cm^2$ to about $8\times10^{12}/cm^2$.

11. The method of claim 1 wherein step (d) is an annealing step.

12. The method of claim 2 wherein step (d) is an annealing step.

13. The method of claim 3 wherein step (d) is an annealing step.

14. The method of claim 4 wherein step (d) is an annealing step.

15. The method of claim 5 wherein step (d) is an annealing step.

16. The method of claim 6 wherein step (d) is an annealing step.

17. The method of claim 7 wherein step (d) is an annealing step.

18. The method of claim 8 wherein step (d) is an annealing step.

19. The method of claim 9 wherein step (d) is an annealing step.

20. The method of claim 10 wherein step (d) is an annealing step.

* * * * *